(12) United States Patent
Satake et al.

(10) Patent No.: US 11,094,509 B2
(45) Date of Patent: Aug. 17, 2021

(54) PLASMA PROCESSING APPARATUS

(71) Applicant: HITACHI HIGH-TECH CORPORATION, Tokyo (JP)

(72) Inventors: Makoto Satake, Tokyo (JP); Kenetsu Yokogawa, Tokyo (JP); Tadayoshi Kawaguchi, Tokyo (JP); Takamasa Ichino, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 397 days.

(21) Appl. No.: 15/437,040

(22) Filed: Feb. 20, 2017

(65) Prior Publication Data

US 2018/0068835 A1 Mar. 8, 2018

(30) Foreign Application Priority Data

Sep. 5, 2016 (JP) .............................. JP2016-172382

(51) Int. Cl.
*H01J 37/32* (2006.01)
*C23C 16/509* (2006.01)
(Continued)

(52) U.S. Cl.
CPC ...... *H01J 37/32651* (2013.01); *C23C 16/509* (2013.01); *C23C 16/52* (2013.01);
(Continued)

(58) Field of Classification Search
None
See application file for complete search history.

(56) References Cited

U.S. PATENT DOCUMENTS

| 6,946,054 B2 * | 9/2005 | Brcka ................... H01J 37/321 118/723 I |
| 9,039,865 B2 | 5/2015 | Yoshioka et al. |

(Continued)

FOREIGN PATENT DOCUMENTS

| JP | 2000-323298 A | 11/2000 |
| JP | 2011-103346 A | 5/2011 |

(Continued)

OTHER PUBLICATIONS

Office Acton dated Jul. 17, 2019 in corresponding Japanese Application No. 2016-172382.
(Continued)

*Primary Examiner* — Jethro M. Pence
(74) *Attorney, Agent, or Firm* — Miles & Stockbridge, P.C.

(57) ABSTRACT

The features of the present invention are that a plasma processing apparatus includes: a process chamber in which a sample is plasma-processed; a dielectric window which airtightly seals an upper part of the process chamber; an inductive antenna which is disposed at an upper part of the dielectric window and forms an induction magnetic field; a radio frequency power source which supplies radio frequency power to the inductive antenna; and a Faraday shield to which radio frequency power is supplied from the radio frequency power source and which is disposed between the dielectric window and the inductive antenna, and the plasma processing apparatus further includes a monitoring unit which monitors a current flowing in the Faraday shield and a control unit which controls the monitored current.

3 Claims, 3 Drawing Sheets

(51) Int. Cl.
  *C23C 16/52* (2006.01)
  *H01L 21/67* (2006.01)
(52) U.S. Cl.
  CPC ......... *H01J 37/321* (2013.01); *H01J 37/3211* (2013.01); *H01J 37/3299* (2013.01); *H01J 37/32119* (2013.01); *H01J 37/32183* (2013.01); *H01J 37/32935* (2013.01); *H01J 37/32449* (2013.01); *H01J 2237/334* (2013.01); *H01J 2237/3321* (2013.01); *H01L 21/67069* (2013.01)

(56) References Cited

U.S. PATENT DOCUMENTS

| | | |
|---|---|---|
| 9,583,312 B2 | 2/2017 | Yamawaku et al. |
| 2011/0132540 A1 | 6/2011 | Sakka et al. |
| 2013/0087288 A1 | 4/2013 | Sakka et al. |
| 2014/0170859 A1* | 6/2014 | Yamawaku ....... H01L 21/68764 438/778 |

FOREIGN PATENT DOCUMENTS

| | | |
|---|---|---|
| JP | 2013080643 A | 5/2013 |
| JP | 2014-120564 A | 6/2014 |
| JP | 2015146428 A | 8/2015 |
| KR | 10-2011-0065252 A | 6/2011 |

OTHER PUBLICATIONS

Office Action dated Dec. 12, 2017 for related Korean Patent Application No. 10-2017-0000108.

* cited by examiner

PLASMA PROCESSING APPARATUS

BACKGROUND OF THE INVENTION

1. Field of the Invention

The present invention relates to an inductively coupled plasma processing apparatus.

2. Description of the Related Art

For a semiconductor device manufacturing apparatus, an etching apparatus and a chemical vapor deposition (CVD) apparatus, which employ an inductively coupled plasma source, have been widely used. In these inductively coupled plasma processing apparatuses, an inductive antenna with several turns is disposed outside a vacuum chamber. When a radio frequency current flows to the inductive antenna, plasma is generated in the vacuum chamber by an induction magnetic field.

Moreover, as an example of the inductively coupled plasma processing apparatus, JP 2000-323298 A discloses an inductively coupled plasma processing apparatus in which a Faraday shield is placed between an antenna and a vacuum chamber, and inner wall condition in the vacuum chamber is controlled by adjusting a voltage applied to the Faraday shield.

However, to generate high density plasma, a current of a certain ampere or more is required to flow in an inductive antenna. This generates an ununiform voltage of a certain kilovolt or more along the inductive antenna. Furthermore, it is known that stray capacitance exists between this inductive antenna and the plasma. Because the current in the inductive antenna flows in or out the plasma through this stray capacitance, the current in the antenna does not become a constant value. This ununiform current deteriorates the uniformity of the plasma in a circumferential direction, in other words, causes an azimuthal distribution of the plasma.

To improve the azimuthal distribution of the plasma, JP 2011-103346 A discloses a method for suppressing an azimuthal distribution of plasma by electrically placing an annular conductor on a Faraday shield and optimizing the shape of the annular conductor in an apparatus in which the Faraday shield is placed between the antenna and the vacuum chamber.

SUMMARY OF THE INVENTION

However, the azimuthal distribution of the plasma changes depending on process conditions such as plasma density, pressure, a type of process gas and a voltage applied to the Faraday shield. Thus, in a method for placing the annular conductor on the Faraday shield as disclosed in JP 2011-103346 A, it is necessary to replace an annular conductor with an optimum shape suitable for each process condition and is difficult to apply it to mass production.

In light of these problems, the present invention provides a plasma processing apparatus which can improve an azimuthal distribution of plasma in an inductively coupled plasma processing apparatus.

The features of the present invention are that a plasma processing apparatus includes: a process chamber in which a sample is plasma-processed; a dielectric window which airtightly seals an upper part of the process chamber; an inductive antenna which is disposed at an upper part of the dielectric window and forms an induction magnetic field; a radio frequency power source which supplies radio frequency power to the inductive antenna; and a Faraday shield to which radio frequency power is supplied from the radio frequency power source and which is disposed between the dielectric window and the inductive antenna, and the plasma processing apparatus further includes a monitoring unit which monitors a current flowing in the Faraday shield and a control unit which controls the monitored current to be a predetermined value.

The present invention improves the azimuthal distribution of the plasma in the inductively coupled plasma processing apparatus.

DESCRIPTION OF THE PREFERRED EMBODIMENTS

Figure 1:
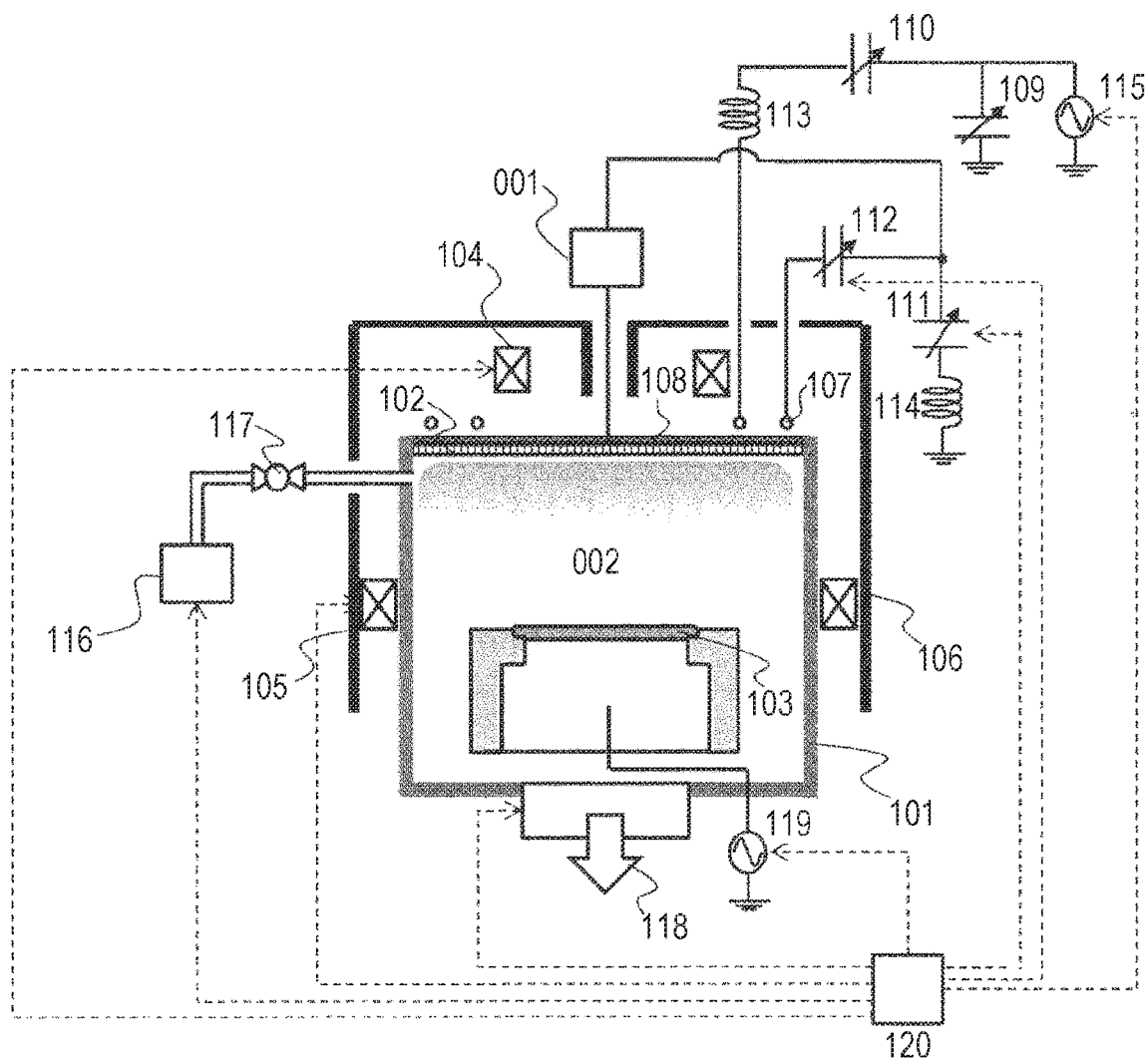
FIG. 1 is a schematic sectional view of an inductively coupled plasma processing apparatus according to the first example.

Hereinafter, each embodiment of the present invention will be described referring to the drawings. First, the first example of the present invention will described.

EXAMPLE 1

FIG. 1 is a schematic sectional view of an inductively coupled plasma processing apparatus according to the example. A vacuum chamber 101 is provided with a dielectric window 102 and an electrode 103 inside. The dielectric window 102 is composed of an insulant such as alumina. The electrode 103 is a sample stage on which a processing wafer, a sample, is placed. Moreover, to control the distribution of static magnetic fields in the vacuum chamber, first direct current coils (DC coils) 104, second DC coils 105 and yokes 106 are disposed outside the vacuum chamber 101. An inductive antenna 107 with two turns is disposed outside the dielectric window 102 which airtightly seals the upper part of the vacuum chamber 101. A Faraday shield 108 is disposed between the dielectric window 102 and the inductive antennas 107.

The inductive antennas 107 and the Faraday shield 108 are electrically connected to a first radio frequency power source 115 through a first variable capacitor 109, a second variable capacitor 110, a third variable capacitor 111, a fourth variable capacitor 112, a first inductance coil 113 and a second inductance coil 114. Herein, the first variable capacitor 109, the second variable capacitor 110 and the first inductance coil 113 are matching circuits for impedance matching with plasma, and the numbers of the capacitors and the inductance coils can be increased or decreased as necessary.

Moreover, a series resonant circuit of the third variable capacitor 111 and the second inductance coil 114 is connected in parallel to the Faraday shield 108. By changing the electrostatic capacity of the third variable capacitor 111, the voltage applied to the Faraday shield 108 can be controlled. In addition, the fourth variable capacitor 112 is connected in series to the inductive antenna 107. By changing the electrostatic capacity of the fourth variable capacitor 112, the current distribution in the inductive antenna can be controlled. By optimizing the electrostatic capacity of the fourth variable capacitor, the azimuthal distribution of the plasma can be suppressed. Note that the number of turns of the inductive antennas 107 shown in FIG. 1 is designed to be two. However, the number of turns is not particularly limited.

A predetermined flow rate of process gas is supplied into the vacuum chamber 101 from a gas feeder system 116 through a gas valve 117. By adjusting the exhaust velocity with an exhaust system 118, a predetermined pressure can be maintained in the vacuum chamber. The part of the process gas supplied from the gas feeder system 116 becomes plasma by radio frequency power applied to the inductive antennas 107 and the Faraday shield 108, and plasma 002 is generated and maintained. At this time, the distribution of static magnetic fields can be changed by using the first DC coils 104 and the second DC coils 105. The density distribution of the plasma 002 can be controlled to any plasma density distribution state.

The frequency of the radio frequency power supplied from the first radio frequency power source 115 is, for example, 13.56 MHz, 27.12 MHz or 2 MHz. By adjusting the electrostatic capacities of the first variable capacitor 109 and second variable capacitor 110, the reflection of the radio frequency power can be suppressed, and impedance matching can be achieved. Moreover, since the processing wafer is irradiated by ions existing in the plasma 002, a radio frequency power ranging from 100 kHz to 13.56 MHz can also be applied to the electrode 103 from a bias power source 119. At this time, by a matching circuit (not shown in FIG. 1) disposed between the electrode 103 and the bias power source 119, the impedance matching can be achieved.

The Faraday shield 108 is composed of a metal conductor having vertical slits and is disposed to cover the dielectric window 102. A radio frequency voltage applied to the Faraday shield can be controlled by the third variable capacitor 111, thereby enabling the inner walls of the dielectric window 102 to be kept in an optimum state.

As described above, controls related to the plasma processing using the abovementioned inductively coupled plasma processing apparatus are performed by a control unit 120.

In the plasma processing apparatus according to the example, an ammeter 001, which measures a current flowing in the Faraday shield, is disposed above a shaft disposed on the upper part of the Faraday shield 108. By the fourth variable capacitor 112 disposed between the terminal of the inductive antenna 107 and the series resonant circuit, a current value flowing in the Faraday shield 108 can be controlled. Herein, the ammeter 001 is desired to be able to monitor the current without being connected in series to a circuit such as a clamp meter. However, its means is not limited as long as the current can be measured.

Moreover, the control unit 120 controls the fourth variable capacitor to minimize a current value flowing into the Faraday shield 108 from the fourth variable capacitor 112, thereby making it possible to suppress ununiformity of the current flowing in the inductive antenna in the circumferential direction. This enables the wafer to be processed by an optimum plasma distribution in which the azimuthal distribution of the plasma is suppressed.

By contrast, when the process condition is changed, it is necessary to optimize the electrostatic capacities of the fourth variable capacitors 112 to minimize the current flowing in the Faraday shield 108 for suppressing the azimuthal distribution of plasma. In the conventional technique which does not install the ammeter 001, prior assessment has been required to use numbers of wafers with different electrostatic capacities of the fourth variable capacitors to determine the optimum electrostatic capacities. However, as in the example, the optimum electrostatic capacities can be decided by using the ammeter 001, namely the electrostatic capacities of the fourth variable capacitors 112 can be controlled to minimize the current flowing in the Faraday shield 108 by monitoring the value of the ammeter 001. Therefore, the wafer can be processed without the prior assessment even when the process conditions are changed, and with an optimum plasma distribution in which the azimuthal distribution is suppressed.

Hereinafter, described is technical significance of controlling the electrostatic capacity of the fourth variable capacitor 112 to minimize the current value flowing in the Faraday shield 108.

Figure 2:
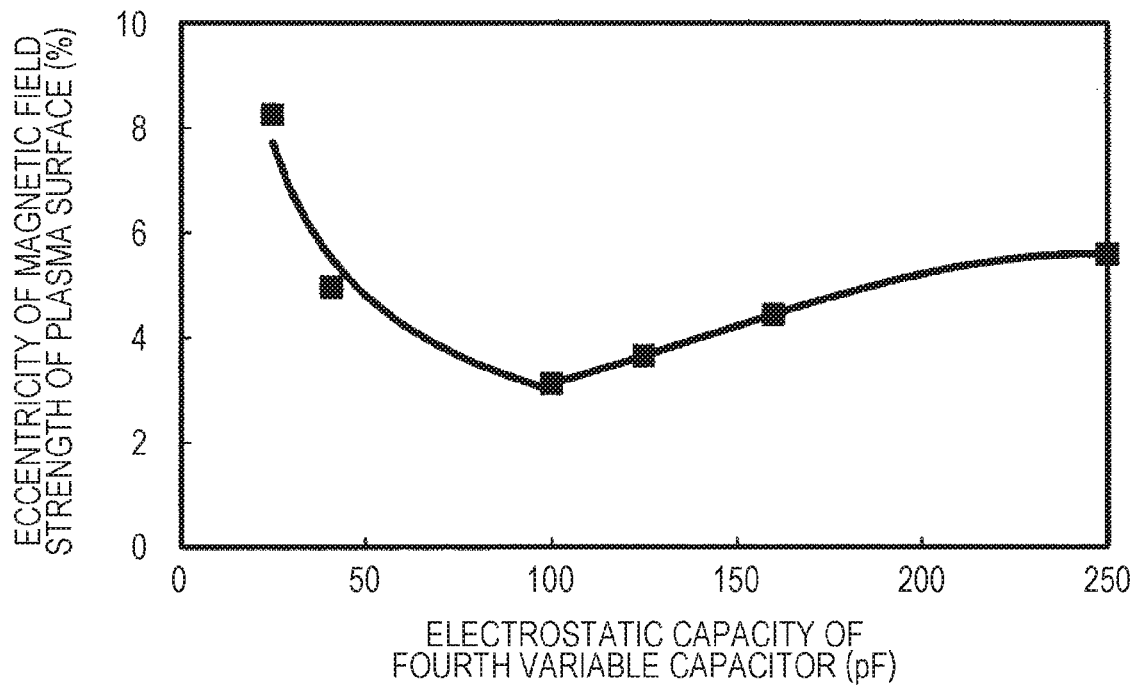
FIG. 2 is a view showing a relationship between an electrostatic capacity of a fourth variable capacitor and an azimuthality of magnetic field strength of a plasma surface.

The fourth variable capacitor 112 and the azimuthality (ununiformity) of the magnetic field strength at the plasma surface in the circumferential direction will be described referring to FIG. 2. FIG. 2 shows results of calculating the azimuthalities (ununiformities) of the magnetic field strength in the circumferential direction at the plasma surface by values of the electrostatic capacities of the fourth variable capacitors 112 based on results of calculating three-dimensional electromagnetic fields in the plasma processing apparatus system shown in FIG. 1. In the calculation of FIG. 2, the plasma 002 is approximated by a uniform conductor with a resistivity of $1.0 \times 10^{-6}$ Ω·cm, and the distribution of the magnetic field strength of the plasma surface is calculated. From this magnetic field strength, the azimuthalities in the circumferential direction are calculated. Moreover, FIG. 3 shows results of calculating a current flowing in the Faraday shield, that is, a current flowing in the ammeter 001 based on equivalent circuit calculation.

Note that the azimuthalities in FIG. 2 are calculated using the equation (1) from the distribution of the magnetic field strength of the plasma surface directly under the center (radius R) of the inductive antenna with two turns. Smaller azimuthalities mean smaller changes in the distribution of the current flowing in the inductive antenna and that plasma with smaller azimuthal distribution can be generated. Moreover, in the equation (1), H (Max) indicates the maximum value of the magnetic field strength of the plasma surface with the radius R, and H (Min) indicates the minimum value of the magnetic field strength of the plasma surface with the radius R.

$$\text{ECCENTRICITY OF MAGNETIC FIELD STRENGTH OF PLASMA SURFACE (\%)} = \frac{H(\text{Max}) - H(\text{Min})}{H(\text{Max}) + H(\text{Min})} \times 100 \quad \text{Equation 1}$$

Figure 3:
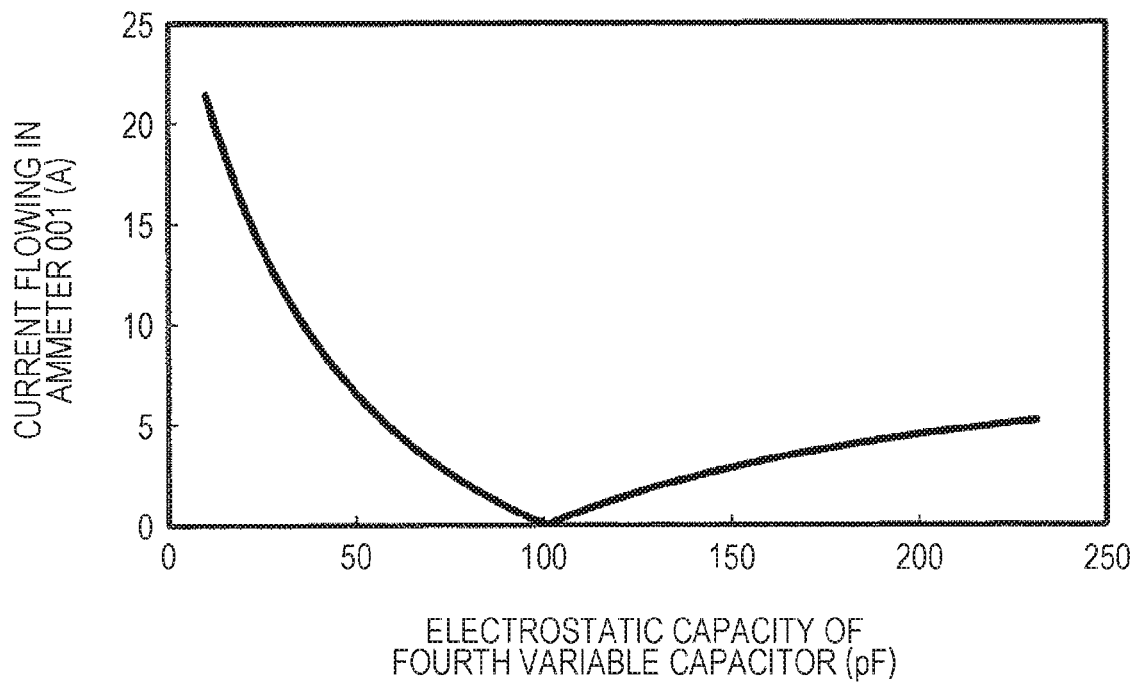
FIG. 3 is a view showing a relationship between the electrostatic capacity of the fourth variable capacitor and a current value flowing in an ammeter 001.

Moreover, for the calculations in FIG. 2 and FIG. 3, conditions that the third variable capacitor 111 and the second inductance coil 114 satisfy series resonant conditions, that is, conditions that a voltage applied to the Faraday shield is 0 V are used, and the calculations are performed for a case where a 1000 W power with a frequency of 13.56 MHz is outputted from the first radio frequency power source 115.

As shown in the results in FIG. 3, when the electrostatic capacity of the fourth variable capacitor 112 is 100 pF, a current value flowing in the ammeter 001 is minimized. This is because a current flowing in and out the Faraday shield from the inductive antenna is minimized by setting the electrostatic capacity of the capacitor connected in series to the inductive antenna to an optimum value. Moreover, by comparing FIG. 2 with FIG. 3, it is clear that, when the electrostatic capacity of the fourth variable capacitor 112 is 100 pF, both the azimuthality of the magnetic field strength of the plasma surface and the current value flowing in the ammeter 001 are minimized, and there is a correlation between the azimuthality of the magnetic field strength of the plasma surface and the current value flowing in the ammeter 001. From this correlation, it is clear that when the current value flowing in the ammeter 001 is minimized, the azimuthality of the magnetic field strength of the plasma surface is minimized. In other words, by minimizing the current value flowing in the Faraday shield 108, the azimuthality of the magnetic field strength of the plasma surface can be minimized. Based on these facts, by measuring the current value flowing in the Faraday shield with the ammeter 001 and controlling the electrostatic capacity of the fourth variable capacitor 112 to minimize the value of the ammeter 001, ununiformity of the radio frequency current flowing in the inductive antenna 107 in the circumferential direction can be suppressed.

Note that it is experimentally confirmed that the azimuthal distribution of the magnetic field strength of the plasma surface of FIG. 2 is also changed by power outputted from the first radio frequency power source 115, pressure in the vacuum chamber 101, type of gas supplied from the gas feeder system 116, magnetic fields generated from the first DC coils 104 and second magnetic field coils 105, and a set value of the third variable capacitor 111, and an optimum value of the fourth variable capacitor 112 is also changed by process conditions. This is because, in the calculations shown in FIG. 2 and FIG. 3, the plasma is assumed to be a uniform conductor with a resistivity of $1.0 \times 10^{-6}$ Ω·cm, and this resistivity is changed by process conditions. However, by measuring the current value flowing in the Faraday shield with the ammeter 001 as previously mentioned and controlling the electrostatic capacity of the fourth variable capacitor 112 to minimize the measured current value, ununiformity of the radio frequency current flowing in the inductive antenna in the circumferential direction can be suppressed.

Moreover, in the calculations of FIG. 2 and FIG. 3, the calculations have been performed under conditions that the third variable capacitor 111 and the second inductance coil 114 satisfy series resonant conditions, that is, conditions that the radio frequency voltage applied to the Faraday shield becomes 0 V. However, when the electrostatic capacity of the third variable capacitor 111 is changed, a voltage is applied to the Faraday shield, and a current also flows to the Faraday shield 108 from the plasma 002 through the dielectric window 102. Thus, the current flowing in the ammeter 001 becomes larger than 0 A even when the fourth variable capacitor is set to an optimum value. However, by setting the current value of the ammeter 001 to be a minimum value, the current flowing to the Faraday shield 108 from the inductive antenna 107 can be minimized, and ununiformity of the radio frequency current flowing in the inductive antenna 107 in the circumferential direction can be suppressed. Next, the second example of the present invention will be described referring to FIG. 4.

EXAMPLE 2

Figure 4:
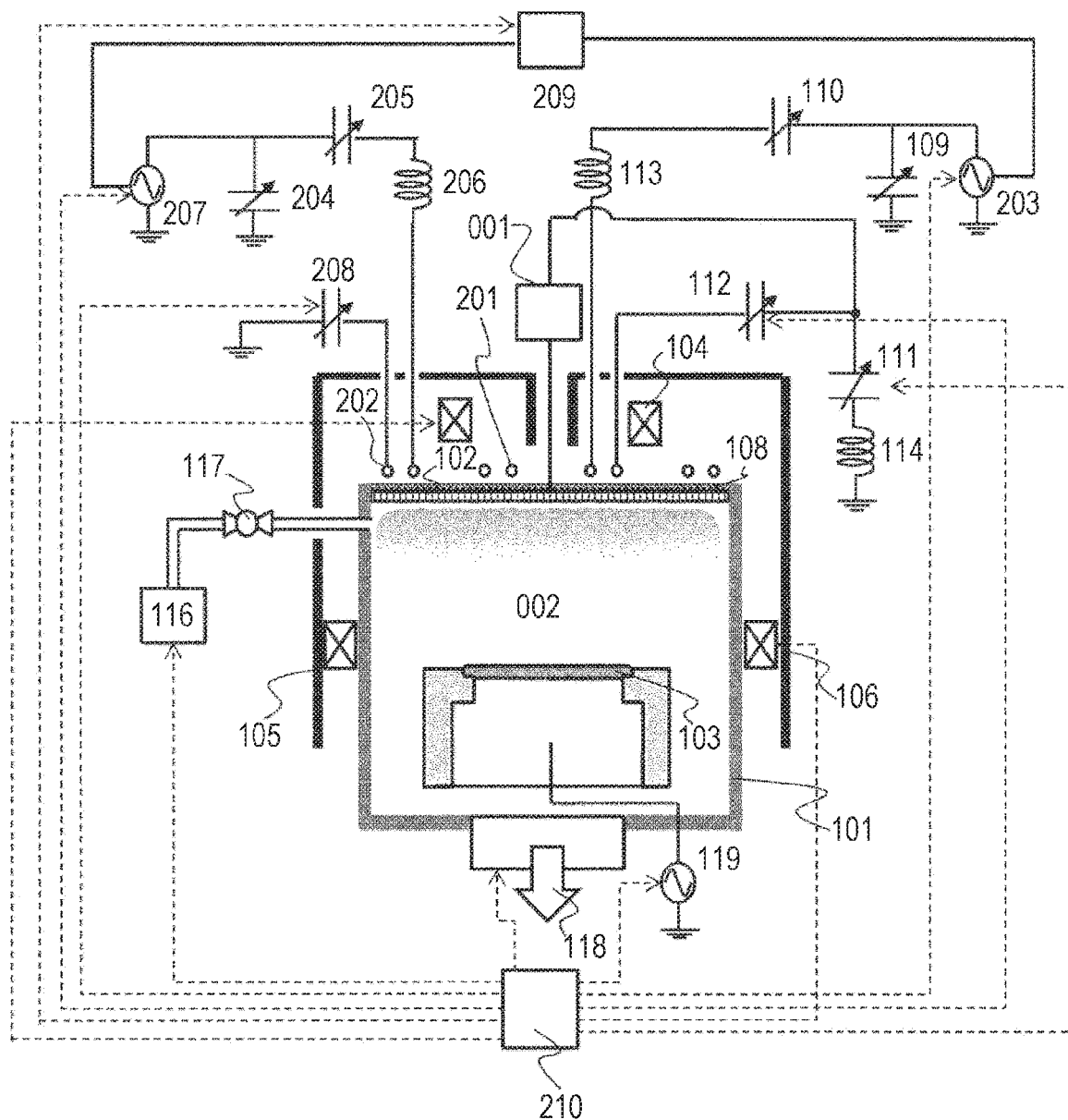
FIG. 4 is a schematic sectional view of an inductively coupled plasma processing apparatus according to the second example.

FIG. 4 is a schematic sectional view of an inductively coupled plasma processing apparatus according to the example. Note that elements shown in FIG. 4 with the same numbers as those in FIG. 1 have the same functions as those in FIG. 1. The upper part of a vacuum chamber 101 is airtightly sealed by a dielectric window 102 which is composed of an insulant such as alumina. The vacuum chamber 101 is provided with an electrode 103 inside on which a processing wafer is placed. Moreover, to control the distribution of magnetic fields in the vacuum chamber, first DC coils 104, second DC coils 105 and yokes 106 are disposed outside the vacuum chamber 101.

First inductive antennas 201 and second inductive antennas 202, which are coiled with two turns, are disposed outside the dielectric window 102. Moreover, a Faraday shield 108 is disposed between the dielectric window 102 and the first inductive antennas 201 and the second inductive antennas 202. Furthermore, the first inductive antennas 201 and the Faraday shield 108 are electrically connected to a first radio frequency power source 203 through a first variable capacitor 109, a second variable capacitor 110, a third variable capacitor 111, a fourth variable capacitor 112, a first inductance coil 113 and a second inductance coil 114. Herein, the first variable capacitor 109, the second variable capacitor 110 and the first inductance coil 113 are matching circuits for impedance matching with plasma, and the numbers of the capacitors and the inductance coils can be increased or decreased as necessary.

Moreover, a series resonant circuit of the third variable capacitor 111 and the second inductance coil 114 is connected in parallel to the Faraday shield 108. By changing the electrostatic capacity of the third variable capacitor 111, a radio frequency voltage applied to the Faraday shield 108 can be controlled. In addition, the fourth variable capacitor 112 is connected in series to the first inductive antenna 201. By changing the electrostatic capacity of the fourth variable capacitor 112, the current distribution in the first inductive antenna 201 can be controlled. By optimizing the electrostatic capacity of the fourth variable capacitor, the azimuthal distribution of the plasma generated by the first inductive antenna 201 can be improved.

The second inductive antenna 202 is electrically connected to a second radio frequency power source 207 through a fifth variable capacitor 204, a sixth variable capacitor 205 and a third inductance coil 206. Herein, the fifth variable capacitor 204, the sixth variable capacitor 205 and the third inductance coil 206 are matching circuits for impedance matching with plasma, and the numbers of the capacitors and the inductance coils can be increased or decreased as necessary. Moreover, a seventh variable capacitor 208 is connected in series to the second inductive antenna 202. By changing the electrostatic capacity of the seventh variable capacitor 208, the current distribution in the second inductive antenna 202 can be controlled.

Furthermore, by setting the electrostatic capacity of the seventh variable capacitor to be an optimum value, the azimuthal distribution of the plasma generated by the second inductive antenna 202 can be suppressed. Note that the number of turns of the first inductive antennas 201 and the second inductive antennas 202 is designed to be two in the example. However, the number of turns may be any numbers.

A predetermined flow rate of process gas is supplied into the vacuum chamber 101 from a gas feeder system 116 through a gas valve 117. By adjusting the exhaust velocity with an exhaust system 118, a predetermined pressure can be maintained in the vacuum chamber. The process gas supplied from the gas feeder system 116 becomes plasma by radio frequency power applied to the first inductive antennas 201, the second inductive antennas 202 and the Faraday shield 108, and plasma 002 is generated and maintained.

The first inductive antennas 201 and the second inductive antennas 202 are connected through a phase control circuit 209. The phase control circuit 209 can adjust phases of radio frequency powers outputted from the first radio frequency power source 203 and the second radio frequency power source 207. Opposite phases are desired especially when the first inductive antennas 201 and the second inductive antennas 202 are coiled in the same direction. Coordinate phases are desired when the first inductive antennas 201 and the second inductive antennas 202 are coiled in opposite directions.

By controlling the output power of the first radio frequency power source 203 and the output power of the second radio frequency power source 207 in this manner, density distribution of the plasma 002 can be controlled. In addition, the distribution of static magnetic fields can be controlled by using first DC coils 104 and second DC coils 105 in the example. The density distribution of the plasma 002 can also be controlled to any density distribution state by the distribution of the static magnetic fields. The frequencies of the radio frequency powers supplied from the first radio frequency power source 203 and the second radio frequency power source 207 are, for example, 13.56 MHz, 27.12 MHz or 2 MHz. By adjusting the capacities of the first variable capacitor 109 and second variable capacitor 110, the reflection of the radio frequency powers can be suppressed, and impedance matching can be achieved.

Moreover, since the processing wafer is irradiated by ions existing in the plasma 002, a radio frequency power with a frequency in a range from 100 kHz to 13.56 MHz can also be supplied to the electrode 103 from a bias power source 119. At this time, by a matching device (not shown) disposed between the electrode 103 and the bias power source 119, the impedance matching can be achieved.

The Faraday shield 108 is composed of a metal conductor having vertical slits and is disposed to cover the dielectric window 102. A radio frequency voltage applied to the Faraday shield can be controlled by the third variable capacitor 111, thereby enabling the inner walls of the dielectric window 102 to be kept in an optimum state.

As described above, controls related to the plasma processing using the abovementioned inductively coupled plasma processing apparatus are performed by a control unit 210.

Moreover, in the inductively coupled plasma processing apparatus of the example, an ammeter 001, which measures a current flowing in the Faraday shield, is disposed above a shaft disposed on the upper part of the Faraday shield 108. The control unit 210 controls the electrostatic capacity of the fourth variable capacitor 112 disposed at a terminal of the first inductive antenna 201 and the electrostatic capacity of the seventh variable capacitor 208 disposed at a terminal of the second inductive antenna 202 to minimize a current value flowing in the Faraday shield.

Note that a reason that the current flowing in the Faraday shield can be minimized by controlling the electrostatic capacities of the fourth variable capacitor 112 and the seventh variable capacitor 208 is that the current flowing in and out the Faraday shield from the inductive antennas is minimized by setting the electrostatic capacities of the capacitors, which are connected in series to the inductive antennas as shown in FIG. 3 of the example 1, to optimum values.

Moreover, as described from the comparison between FIG. 3 and FIG. 2 in the example 1, when the current flowing in the Faraday shield becomes a minimum value, the azimuthality of the magnetic field strength of the plasma surface is also minimized. Thus, by measuring the current flowing in the Faraday shield with the ammeter 001 and controlling the fourth variable capacitor 112 and the seventh variable capacitor 208 to minimize the value of the ammeter 001, ununiformity of the current flowing in the first inductive antennas 201 and the second inductive antennas 202 in the circumferential direction can be suppressed. Furthermore, this enables the wafer to be processed by an optimum plasma distribution in which the azimuthal distribution of the plasma is suppressed.

By contrast, when the process condition is changed, it is necessary to optimize the electrostatic capacities of the fourth variable capacitor 112 and the seventh variable capacitor 208 to minimize the current flowing in the Faraday shield 108 for suppressing the azimuthal distribution of plasma. In the conventional technique which does not install the ammeter 001, prior assessment has been required to use numbers of wafers with different electrostatic capacities of the fourth variable capacitor 112 and the seventh variable capacitor 208 to determine the optimum electrostatic capacities. However, as in the example, the optimum electrostatic capacities can be decided by using the ammeter 001, namely the electrostatic capacities of the fourth variable capacitors 112 and the seventh variable capacitor 208 can be controlled to minimize the current flowing in the Faraday shield 108 by monitoring the value of the ammeter 001. Therefore, the wafer can be processed without the prior assessment even when the process conditions are changed, and with an optimum plasma distribution in which the azimuthal distribution is suppressed.

As described in the examples 1 and 2, in the present invention, by measuring the current flowing in the Faraday shield with the ammeter and controlling the electrostatic capacities of the variable capacitors disposed at the terminals of inductive antennas to minimize the measured current value, a wafer can be processed with an optimum plasma distribution in which the azimuthal distribution of the plasma is suppressed. Note that a word "minimize" in a sentence "the current flowing in the Faraday shield is minimized" indicates not only one value such as a minimum value, but also values included in a range from a minimum value to a predetermined value.

Moreover, the examples described in the examples 1 and 2 were that the variable capacitors are controlled to minimize the monitored current flowing in the Faraday shield. However, the present invention may include a unit which monitors the current flowing in the Faraday shield and control the monitored current. Furthermore, the effects of the invention are as described hereinafter.

In the actual process in which a predetermined pattern is formed on the wafer surface using plasma etching, processed depth and processed dimensions of the pattern formed on the wafer surface may be ununiform in the circumferential direction of the wafer due to an exhaust direction of the process gas, temperature distribution of the wafer surface, and the like. In this case, a uniform pattern can be formed on the entire wafer surface by intentionally making the plasma distribution azimuthal based on the current value of the ammeter 001 so as to correct the azimuthal distribution caused by the exhaust direction of the process gas, the temperature distribution of the wafer surface, and the like.

Furthermore, in the examples 1 and 2, a description has been made with the plasma processing apparatus provided with DC coils. However, the present invention can exert the same effects as those described in the examples 1 and 2 even without the DC coils.

What is claimed is:

1. A plasma processing apparatus comprising:
    a process chamber in which a sample is plasma-processed;
    a dielectric window which airtightly seals an upper part of the process chamber;
    an inductive antenna which is disposed at an upper part of the dielectric window and forms an induction magnetic field;
    a radio frequency power source which supplies radio frequency power to the inductive antenna;
    a Faraday shield to which the radio frequency power is supplied from the radio frequency power source and which is disposed between the dielectric window and the inductive antenna;
    a first variable capacitor electrically coupled at a first end to said inductive antenna and, at a second end, said first variable capacitor is also electrically coupled to (1) a first end of a second variable capacitor which is electrically coupled in series with an inductance coil to form a series resonant circuit, a second end of said inductance coil being electrically coupled to ground, and to (2) a first end of an ammeter which monitors a current flowing to the Faraday shield and which is electrically coupled at a second end with said Faraday shield; and
    a control device configured to control an electrostatic capacity of the first variable capacitor such that the current monitored by said ammeter is a minimum predetermined value.

2. The plasma processing apparatus according to claim 1, wherein the second variable capacitor controls radio frequency voltage applied to the Faraday shield and is grounded through the inductance coil.

3. The plasma processing apparatus according to claim 1, wherein the predetermined value of said electrostatic capacity of said first variable capacitor is controlled to be 100 picofarads (pF).

* * * * *